United States Patent
Koharagi et al.

(10) Patent No.: US 6,844,760 B2
(45) Date of Patent: Jan. 18, 2005

(54) LED DRIVE CIRCUIT

(75) Inventors: Yoshitaka Koharagi, Oita (JP); Masashi Nogawa, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/681,084

(22) Filed: Oct. 8, 2003

(65) Prior Publication Data

US 2004/0124889 A1 Jul. 1, 2004

(30) Foreign Application Priority Data

Oct. 24, 2002 (JP) ........................................ 2002-310091

(51) Int. Cl.[7] .............................................. H03B 1/00
(52) U.S. Cl. ...................................... 327/110; 327/514
(58) Field of Search .................... 327/72–73, 77–81, 327/86–90, 108–110, 172, 374–377, 427, 512–514; 345/82, 207

(56) References Cited

U.S. PATENT DOCUMENTS

| | | | | |
|---|---|---|---|---|
| 5,514,989 A | * | 5/1996 | Sato et al. .................. | 327/109 |
| 6,472,854 B2 | * | 10/2002 | Ootani ........................ | 323/272 |
| 6,628,252 B2 | * | 9/2003 | Hoshino et al. .............. | 345/82 |
| 6,724,376 B2 | * | 4/2004 | Sakura et al. ................ | 345/204 |

* cited by examiner

Primary Examiner—My-Trang Nu Ton
(74) Attorney, Agent, or Firm—W. Daniel Swayze, Jr.; W. James Brady; Frederick J. Telecky, Jr.

(57) ABSTRACT

A drive circuit for LEDs or other light-emitting elements with which the influence of the changes in temperature or power supply voltage and the element variations can be restrained in order to output a pulse current with a constant level. When n-type MOS transistor 10 is on, power is supplied from switching power supply 60 to the LED, and the current of LED is detected by resistor 20. The error signal Serr between said detection signal Sfb and setpoint signal Sref is generated by error signal generating unit 30 and is averaged by signal holding unit 40. The power supplied to the LED is controlled corresponding to the averaged error signal SerrA. When n-type MOS transistor 10 is turned off from the on state, the power supplied to the LED is stopped, and error signal SerrA is held in signal holding unit 40. When n-type MOS transistor 10 is turned on from the off state, the averaging of error signal Serr is started with the signal level of the held error signal SerrA used as the initial level.

14 Claims, 3 Drawing Sheets

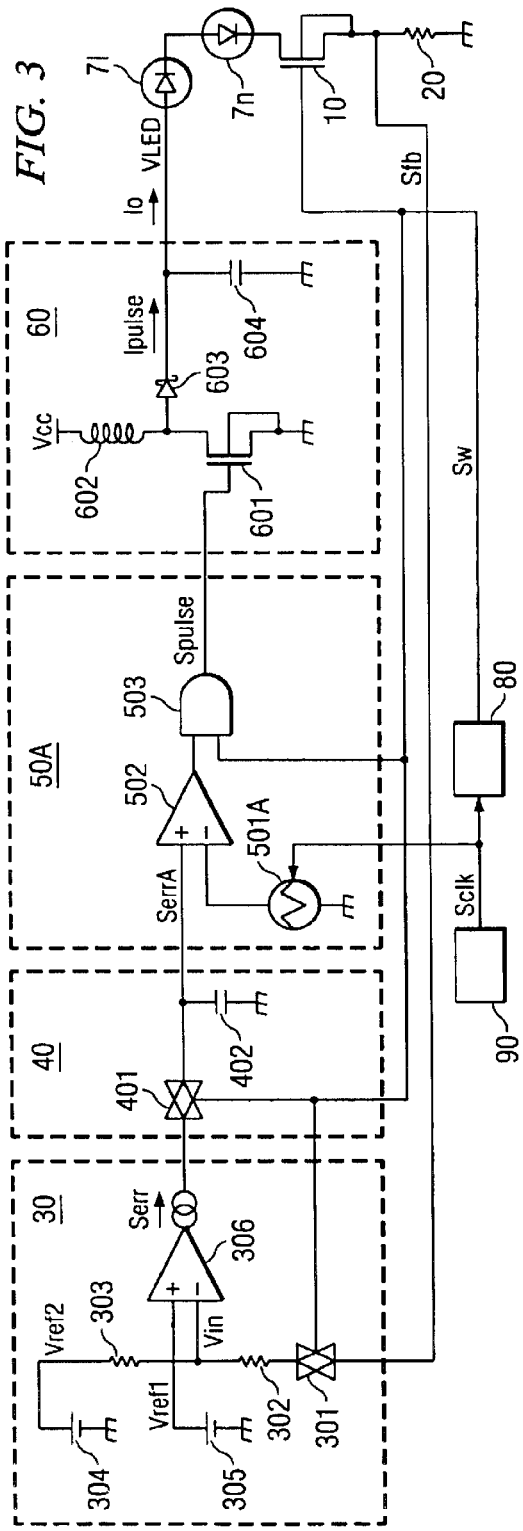
FIG. 3
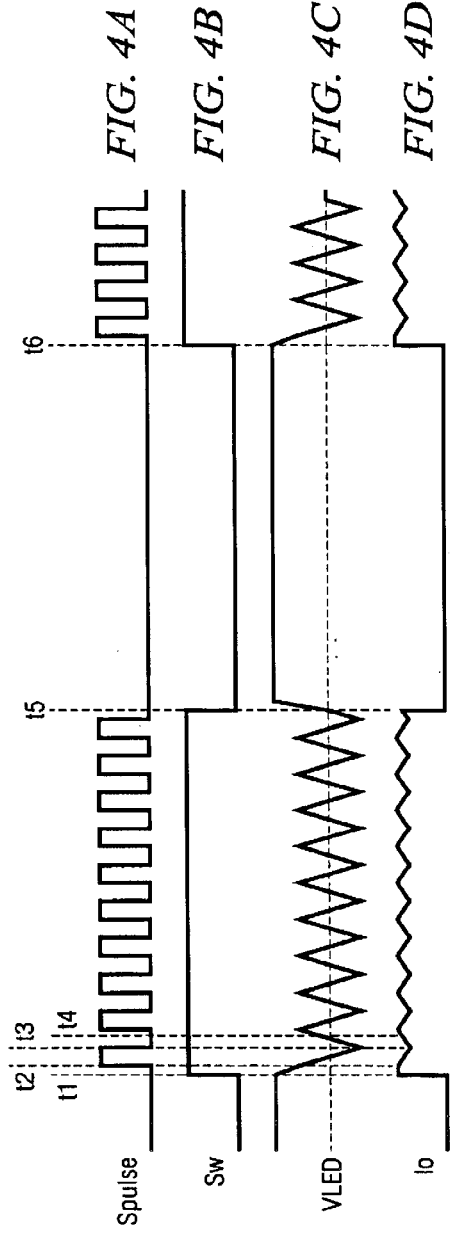
FIG. 4A
FIG. 4B
FIG. 4C
FIG. 4D

US 6,844,760 B2

LED DRIVE CIRCUIT

FIELD OF THE INVENTION

The present invention pertains to a drive circuit, for example, a drive circuit for driving an LED (light-emitting diode) or other light-emitting elements.

BACKGROUND OF THE INVENTION

LED or other light-emitting elements are usually used as the light source for backlight in a liquid-crystal display device. A light source for backlighting usually has a light intensity adjusting function (light adjusting function) in order to adjust the visibility or increase the power consumed by lighting. The light adjusting function is usually realized by the drive circuit for the light-emitting element.

The simplest method of adjusting the amount of light emitted from an LED is to adjust the current flow to the LED. However, since the hue of the LED varies corresponding to the current, when the current is changed to adjust the amount of light, the hue of the LED also changes. In particular, in a white LED, the change in hue will significantly affect the display quality. Consequently, a PWM (pulse-width modulation) method is usually used to adjust the amount of light emitted by the LED.

In the PWM method, a periodic pulse current is supplied to the LED to flash the LED repeatedly. If the LED flashes very quickly, the brightness sensed by the human eye appears constant depending on the persistence. Since the on-time of the LED is adjusted by adjusting the pulse width of the current, the brightness sensed by the human eye changes. Since the current supplied to the LED by means of the PWM method can be held constant, the problem, that is, the change in hue along with the change in the amount of light, can be avoided.

The purpose of the present invention is to solve the problems by providing a drive circuit that can suppress the influence of the changes in temperature or power supply voltage and the variation in elements occurring during manufacturing and to output a pulse current with a constant level.

SUMMARY OF THE INVENTION

Embodiments of the present invention provide a drive circuit for LEDs or other light-emitting elements with which the influence of the changes in temperature or power supply voltage and the element variations can be restrained in order to output a pulse current with a constant level.

In a first drive circuit according to an embodiment of the present invention, when the switch is on, power is supplied from the switching power supply to the driven object. After the supply of power is received, the current flow to the driven object is detected by the detecting means. The detection signal corresponding to the detection result is output from the detecting means. An error signal corresponding to the error between the detection signal and the setpoint signal is generated in the error signal generating means. The generated error signal is averaged in the signal holding means. The switching power supply controls the power supplied to the driven object corresponding to the generated error signal. When the switch is turned off from the on state, the averaged error signal is held in the signal holding means, and the supply of power to the driven object by the switching power supply is stopped. When the switch is turned on from the off state, in the signal holding means, with the signal level of the held error signal used as the initial level, averaging of the error signal is started.

In a second drive circuit according to an embodiment of the present invention, when the switch is on, power is supplied from the switching power supply to the driven object. After the supply of power is received, the current flow to the driven object is detected by the detecting means. The detection signal is averaged in the signal holding means. An error signal corresponding the error between the averaged detection signal and the setpoint signal is generated in the error signal generating means. The switching power supply controls the power supplied to the driven object corresponding to the generated error signal. When the switch is turned off from the on state, the averaged detection signal is held in the signal holding means, and the supply of power to the driven object by the switching power supply is stopped. When the switch is turned on from the off state, in the signal holding means, with the signal level of the held detection signal as the initial level, the averaging of the detection signal is started.

The first and second drive circuits may also have a switch control means that turns on and off the switch at a prescribed phase of the switching period of the switching power supply. In the first drive circuit, the signal holding means can also hold the error signal before the switch is turned off and start averaging of the error signal after the switch is turned on. In the second drive circuit, the signal holding means can also hold the detection signal before the switch is turned off and start the averaging of the detection signal after the switch is turned on.

The third drive circuit of the present invention has a first switching element that controls the supply of current to a driven object element, a second switching element connected to the inductive element in the power supply circuit that supplies current to the driven object element, an error signal generating circuit that compares the detection signal corresponding to the current flowing in the driven object element with a reference signal and generates an error signal corresponding to the comparison result, and a power supply control circuit that generates a drive pulse signal used for driving the second switching element on the basis of the error signal and supplies it to the second switching element synchronously with the control pulse signal that controls the first switching element.

An advantage of embodiments of the present invention is the influence of changes in temperature or power supply voltage and manufacturing variations of the elements can be restrained so that a pulse current with a constant level can be output.

BRIEF DESCRIPTION OF THE DRAWINGS

FIG. 3 is a block diagram illustrating an example of the configuration of the drive circuit disclosed in the third embodiment of the present invention.

FIG. 4 is a timing chart illustrating an example of the relationship between the signal waveform and timing of each part in the drive circuit shown in FIG. 3.

REFERENCE NUMERALS AND SYMBOLS AS SHOWN IN THE DRAWINGS

In the figures, 10, 601 represent n-type MOS transistors, 20, 302, 303 represent resistors, 30, 30A error signal generating units, 40, 40A signal holding units, 50, 50A switching power supply control units, 60 a switching power supply, 70–70n LEDs, 80 a switch control unit, 90 a clock signal generating unit, 301, 401 transfer gates, 304, 305, 307 reference voltage sources, 306, 308 differential amplifiers, 402, 405, 604 capacitors, 403 an amplifier, 501, 501A triangle wave signal generating circuits, 502 a comparator, 503 an AND circuit, 602 an inductor, and 603 a diode.

DESCRIPTION OF THE EMBODIMENTS

Figure 1:
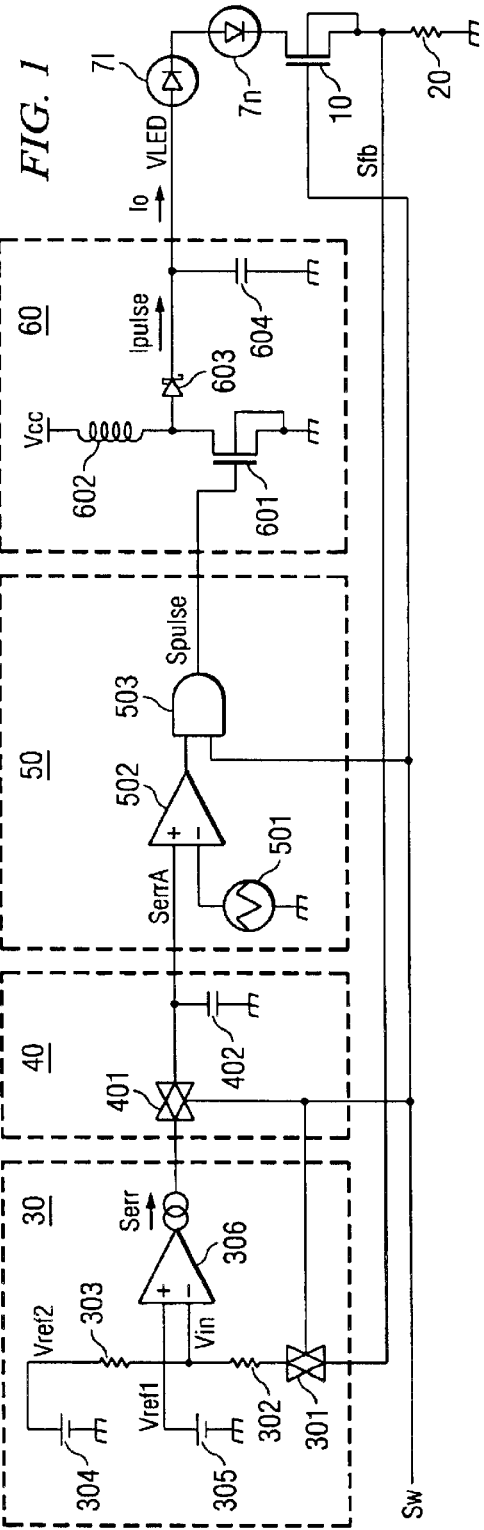
FIG. 1 is a block diagram illustrating an example of the configuration of the drive circuit disclosed in the first embodiment of the present invention.

FIG. 1 is a block diagram illustrating an example of the configuration of the drive circuit disclosed in a first embodiment of the present invention. the drive circuit shown in FIG. 1 has n-type MOS transistor 10, resistor 20, error signal generating unit 30, signal holding unit 40, switching power supply control unit 50, and switching power supply 60. Error signal generating unit 30 includes transfer gate 301, reference voltage sources 304 and 305, resistors 302 and 303, and differential amplifier 306. Signal holding unit 40 includes transfer gate 401 and capacitor 402. Switching power supply control unit 50 includes triangle wave signal generating circuit 501, converter 502, and AND circuit 503. Switching power supply 60 includes n-type MOS transistor 601, inductor 602, diode 603, capacitor 604.

N-type MOS transistor 10 is an embodiment of the switch used in the present invention. Resistor 20 is an embodiment of the detecting means used in the present invention. Error signal generating unit 30 is an embodiment of the error signal generating means used in the present invention. Signal holding unit 40 is an embodiment of the signal holding means used in the present invention. Switching power supply control unit 50 is an embodiment of the switching power supply control means used in the present invention. Switching power supply 60 is an embodiment of the switching power supply used in the present invention.

In the drive circuit shown in FIG. 1, n (n is an integer) LED 71–7n connected in series is the driven object. Drive current Io is supplied to this driven object. Drive current Io is output from switching power supply 60 and flows to reference potential line G via LED 71–7n.

N-type MOS transistor 10 is inserted in the current path of drive current Io and is turned on or off corresponding to switch control Sw input to the gate to interrupt current Io flowing to LED 71–7n. As shown in FIG. 1, the drain is connected to the terminal on the side of the cathode of series connected LED 71–7n, and the source is connected to reference potential line G via resistor 20. The voltage generated across resistor 20 is input as detection signal Sfb to error signal generating unit 30.

Differential amplifier 306 is a current output type amplifier that outputs a current corresponding to the voltage difference between the positive input terminal and the negative input terminal. The reference voltage Vref1 of reference voltage source 305 is input to the positive input terminal. The reference voltage Vref2 of reference voltage source 304 is input to the negative input terminal via resistor 303, and detection signal Sfb is input via resistor 302 and transfer gate 301. The current output from differential amplifier 306 is input as error signal Serr to signal holding unit 40.

The output terminal of differential amplifier 306 is connected to one end of capacitor 402 via transfer gate 401. The other end of capacitor 402 is connected to reference potential line G. The voltage generated across capacitor 402 is input as error signal SerrA into switching power supply control unit 50.

Error signal SerrA is input to the positive terminal of collector 502, while the triangle wave signal of triangle wave signal generating circuit 501 is input to the negative input terminal. The output signal of collector 502 and switch control signal Sw are input to two-input AND circuit 503. The output signal of AND circuit 503 is input as pulse signal Spulse to switching power supply 60.

Pulse signal Spulse is input to the gate of n-type MOS transistor 601, the source of which is connected to reference potential line G, and the drain is connected to power supply line Vcc via inductor 602. The anode terminal of diode 603 is connected to the node connecting inductor 602 and n-type MOS transistor 421. The cathode terminal of diode 603 is connected to reference potential line G via capacitor 604.

The pulse current Ipulse output from the cathode terminal of diode 603 is smoothed by charging capacitor 604. The smoothed current Io is output as drive current Io for LED 71–7n.

The operation of the drive circuit with the configuration shown in FIG. 1 will be explained below.

When switch control signal Sw is at the high level, n-type MOS transistor 10 is in the on state, and current Io is supplied to LED 71–7n. In this case, since transfer gate 301 is in the on state, the voltage generated across resistor 20 by current Io is applied to resistor 302 via transfer gate 301. When resistors 302 and 303 have a much higher resistance than resistor 20, the voltage Vn at the negative input terminal of differential amplifier 306 can be approximated by the following equation.

[Equation 1]

$$Vn = (Vref2 \times R302 + Vfb \times R303)/(R302 + R303) \quad (1)$$

In Equation 1, R302 represents the resistance of resistor 302, R303 represents the resistance of resistor 303, and Vfb represents the voltage generated across resistor 20.

As shown in Equation 1, the voltage Vn at the negative input terminal of differential amplifier 306 is obtained by synthesizing voltage Vfb of resistor 20 and reference voltage Vref2 in proportion to the resistance ratio of resistors 302 and 303. In other words, voltage Vn can easily supply an offset voltage to the voltage Vfb of resistor 20.

The current corresponding to the level difference between voltage Vn and reference voltage Vref1 is output as error signal Serr from differential amplifier 306. When switch control signal Sw is at the high level, since transfer gate 401 is in the on state, the current output from differential amplifier 306 charges or discharges capacitor 402 via transfer gate 401.

The voltage generated across capacitor 402 is compared with the triangle wave signal of triangle wave signal 501 in comparator 502. The output signal of comparator 502 is at the high level if the voltage of the triangle wave signal is lower than the voltage of capacitor 402 and is at the low level otherwise. As a result, a signal whose pulse width corresponds to the voltage of capacitor 402 is output from comparator 502. Since switch control signal Sw is at the high level, the pulse signal output from comparator 502 passes through AND circuit 503 as is and is input as pulse signal Spulse to the gate of n-type MOS transistor 601. The frequency of the triangle wave signal output from triangle wave signal 501 is, for example, in the range of 500 KHz–1 MHz.

When pulse signal Spulse is at the high level, n-type MOS transistor 601 is in the on state, and current flows from power supply line Vcc to reference potential line G through inductor 602 and n-type MOS transistor 601. Energy is stored in inductor 602 by this current. When the pulse signal Spulse is switched to the low level, n-type MOS transistor 601 is turned off, and the energy stored in inductor 602 is released as current. This current charges capacitor 604 via diode 603. Current Io is generated corresponding to the voltage on capacitor 604 and is supplied to LED 71–7n. The number of series connected LED 71–7n is, for example, 2–5. Also, when the voltage drop of the LED is about 3.6 V and the number of series connected LEDs is 5, a voltage of about 21 V is output from switching power supply 60.

If current Io is higher than the setpoint current, the voltage Vn at the negative input terminal of differential amplifier 306 goes above reference voltage Vref1. As a result, the output current of differential amplifier 306 flows in the direction to discharge capacitor 402, and the voltage of capacitor 402 drops. When the voltage of capacitor 402 drops, the pulse width of the high-level signal output from collector 502 becomes narrower, and the conductive period of n-type MOS transistor 601 becomes shorter. In this way, the energy stored in inductor 602 is reduced, and output current Io is also reduced. On the other hand, when current Io is lower than the setpoint current, the output current of differential amplifier 306 flows in the direction to charge capacitor 402, and the voltage of capacitor 402 rises. The pulse width of the high-level signal output from comparator 502 becomes wider. In this way, the conductive period of n-type MOS transistor 601 becomes longer. The energy stored in inductor 602 is increased, and output current Io is also increased. As result of the negative feedback control conducted in this way, current Io becomes approximately equal to the setpoint current.

When switch control Sw switches from the high level to the low level, n-type 1 MOS transistor 10 is turned off, and output current Io becomes zero. Therefore, most of the pulse current Ipulse output from diode 603 flows into capacitor 604. At that time, the output signal of AND circuit 503 is at the low level, and n-type MOS transistor 601 is turned off. Since the storage of new energy in inductor 602 is stopped, pulse current Ipulse depletes when all of the energy remaining in inductor 602 is released. Consequently, if capacitor 604 has an appropriately high capacitance, the voltage rise of capacitor 604 can indeed be restrained within the allowable range after n-type MOS transistor 10 is turned off.

Also, when switch control signal Sw switches from the high level to the low level, since transfer gate 401 is turned off, the charge and discharge of capacitor 402 by the output current of differential amplifier 306 are stopped. If the positive input terminal of comparator 502 has a sufficiently high impedance, the voltage generated across capacitor 402 can be held approximately constant.

When switch signal Sw switches from the high level to the low level, since transfer gate 301 is also turned off, the current flow to resistor 302 is approximately zero, and the voltage Vn at the negative input terminal of differential amplifier 306 is approximately equal to reference voltage Vref2.

If transfer gate 301 is kept in the on state, since voltage Vfb generated across resistor 20 drops to the voltage of reference potential line G, as can be seen from equation 1, voltage Vn drops, and the differential voltage input to differential amplifier 306 becomes high. When transfer gate 301 is turned off, since voltage Vn rises to reference voltage Vref2, the increase in the differential voltage can be restrained. In this way, the saturation of differential amplifier 306 can be alleviated, and the time until differential amplifier 306 returns to the normal operating state can be reduced.

When switch signal Sw switches back from the low level to the high level, transfer gates 301 and 401 are turned on and AND circuit 503 becomes a pass-through state, the feedback control of output current Io is restarted. At that time, the voltage at the time that n-type MOS transistor 10 is turned off from the previous on state is held at capacitor 402. With the held voltage used as the initial value, the charge and discharge of capacitor 402 by the output current of differential amplifier 306 is restarted. Since the change in output current Io caused by the changes in temperature or power supply voltage is usually well delayed compared with the switching period of n-type MOS transistor 10, the difference between the voltage held at capacitor 402 at the end of the previous feedback operation and the voltage held at capacitor 402 when the system converges to the normal operating state in the next feedback operation will not be too large. Consequently, current Io output from switching power supply 60 will quickly converge to the normal level after n-type MOS transistor 10 returns to the on state.

As explained above, according to the drive circuit shown in FIG. 1, since output current Io is adjusted by feedback control, if reference voltages Vref1 and Vref2 are kept constant, the variation in output current Io caused by the change in temperature or power supply voltage, the manufacturing variation of the elements, etc. can be effectively restrained to obtain a very stable output current Io. A stable reference voltage with little variation can easily be generated using a band gap circuit, for example.

Since output current Io is stabilized as described above, the amount of light emitted by LED 71–7n driven by current Io can be stabilized, and the variation in hue can be restrained. Also, since current Io can be set to a prescribed level independent of the dispersion in the forward voltage of the LED, there is no need to use a variable resistor, etc. to adjust the amount of light emitted. Therefore, the work and time required for adjustment can be reduced.

If the pulse oscillation of pulse signal Spulse is not stopped with switch 10 turned off, since the storage and the release of the energy in inductor 602 are repeated, pulse current Ipulse is output continuously. Since output current Io is blocked in n-type MOS transistor 10, all of the pulse current Ipulse flows into capacitor 604, and the voltage of capacitor 604 rises without limit. If the voltage exceeds the breakdown voltage of diode 603 or n-type MOS transistor 10, these elements will be damaged.

According to the drive circuit shown in FIG. 1, when n-type MOS transistor 10 is turned off, the oscillation of pulse signal Spulse in switching power supply control circuit 50 is stopped, and the gate of n-type MOS transistor 601 is fixed to the low level. In this way, the storage and the release of energy in inductor 602 are stopped, and the output of power in switching power supply 60 is stopped. Consequently, an over-voltage condition at the output terminal of switching power supply 60 can be prevented.

Also, if transfer gates 301 and 401 are not turned off and the voltage of capacitor 402 is held when n-type MOS transistor 10 is turned off, since the voltage on capacitor 402 is such that output current Io with a zero current value approaches the setpoint current, the voltage on capacitor 402 becomes higher, and the on period of pulse signal Spulse becomes longer. In other words, a pulse signal that controls output current Io to a very high current is output from comparator 502. When n-type MOS transistor 10 is turned on again in this signal state, output current Io temporarily becomes higher than the setpoint current. As a result, a very long period of time is need until the current converges to the setpoint current.

According to the drive circuit shown in FIG. 1, when n-type MOS transistor 10 is on, capacitor 402 is charged/discharged by the output current of error signal generating unit 30. When n-type MOS transistor 10 is turned off from the on state, the voltage generated across capacitor 402 is held. When n-type MOS transistor 10 is turned on from the off state, with the held voltage as the initial voltage, the charge/discharge of capacitor 402 by the output current of error signal generating unit 30 is started. Consequently, when n-type MOS transistor 10 is turned on again, the voltage of capacitor 402 is close to the normal level of the feedback system. Since the feedback control is restarted, output current Io can be quickly converged to the regular level. In this way, the amount of light emitted by the LED can be further stabilized.

Second Embodiment

Figure 2:
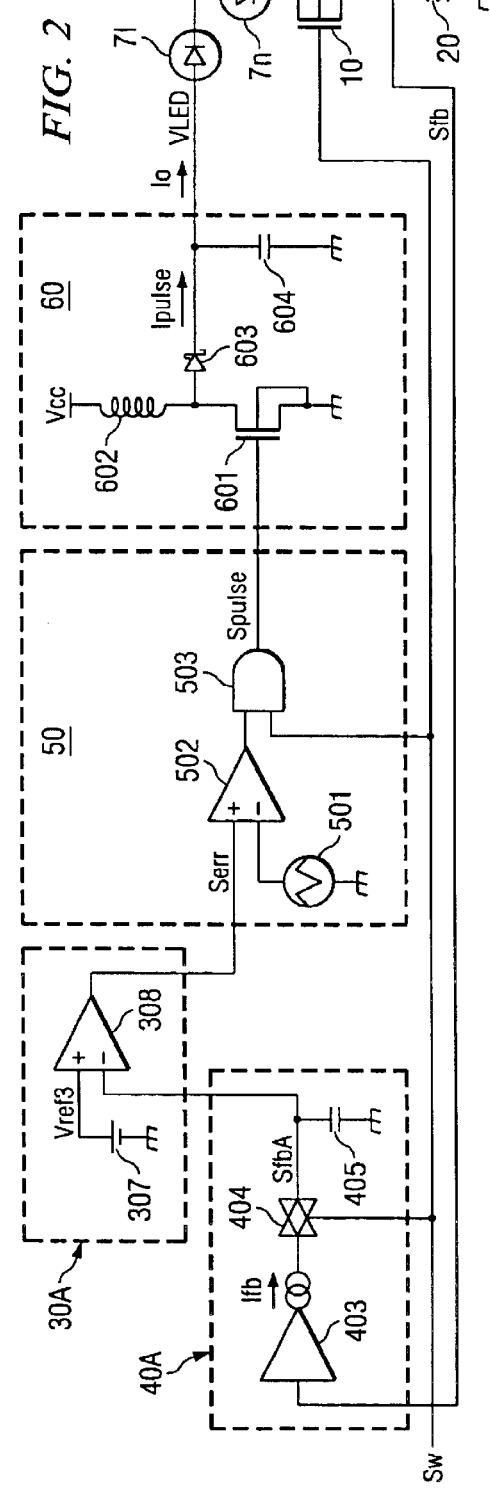
FIG. 2 is a block diagram illustrating an example of the configuration of the drive circuit disclosed in the second embodiment of the present invention.

FIG. 2 is a block diagram illustrating an example of the configuration of the drive circuit disclosed in a second embodiment of the present invention. In FIGS. 1 and 2, the same symbols represent the same respective constituent elements.

In the drive circuit shown in FIG. 2, error signal generating unit 30 and signal holding unit 40 in the drive circuit shown in FIG. 1 are replaced with error signal generating unit 30A and signal holding unit 40A, respectively.

Error signal generating unit 30A includes reference voltage source 307 and differential amplifier 308. Signal holding unit 40A includes amplifier 403, transfer gate 404, capacitor 405. Error signal generating unit 30A is an embodiment of the error signal generating unit used in the present invention. Signal holding unit 40A is an embodiment of the signal holding unit used in the present invention. Amplifier 403 amplifies the detection signal Sfb as a voltage generated across resistor 20 to output a current corresponding to detection signal Sfb. The output terminal of amplifier 403 is connected to one end of capacitor 405 via transfer gate 404. The other end of capacitor 405 is connected to reference potential line G. The voltage generated across capacitor 405 is input as detection signal SfbA to error signal generating unit 30A.

Differential amplifier 308 outputs a voltage corresponding to the voltage difference between the positive input terminal and the negative input terminal. The reference voltage Vref3 of reference voltage source 307 is input to the positive input terminal, and detection signal SfbA is input to the negative input terminal. The voltage output differential amplifier 306 is input as error signal Serr to switching power supply control unit 50.

The operation of the drive circuit shown in FIG. 2 having the configuration will be explained with emphasis on the operation of error signal generating unit 30A and signal holding unit 40A.

When switch control signal Sw is at the high level, n-type MOS transistor 10 is turned on, and current Io is supplied to LED 71–7n. The voltage generated across resistor 20 corresponding said current Io is input as detection signal Sfb to signal holding unit 40A and is amplified by amplifier 403. In this case, since transfer gate 404 is on, the current output from amplifier 403 charges or discharges capacitor 405 via transfer gate 404.

The voltage generated across capacitor 405 is input as detection signal SfbA to error signal generating unit 30A. The voltage corresponding to the level difference between reference voltage Vref3 and detection signal SfbA is output as error signal Serr from differential amplifier 308.

Pulse signal Spulse having a pulse width corresponding to error signal Serr is output from switching power supply control unit 50, and current Io corresponding to this pulse width is supplied from switching power supply 60 to LED 71–7n. The detailed operation of switching power supply control unit 50 and switching power supply 60 is omitted since it has already been explained.

When current Io is greater than the setpoint current, the voltage of signal SfbA exceeds reference voltage Vref3, and the voltage of error signal Serr output from differential amplifier 308 drops. The pulse width of pulse signal Spulse becomes narrower, and output current Io decreases. On the other hand, if current Io is less than the setpoint current, the voltage of signal SfbA falls below reference voltage Vref3. The voltage of error signal Serr output from differential amplifier 308 rises. The pulse width of pulse signal Spulse becomes wider, and output current Io increases. As result of the negative feedback control conducted in this way, current Io becomes approximately equal to the setpoint current.

When switch control signal Sw switches from the high level to the low level, since the output signal of AND circuit 503 is fixed at the low level, the feedback control of output current Io is stopped. In this case, since transfer gate 404 is turned off, the charge and discharge of capacitor 405 by the output current of amplifier 403 is stopped. If the input terminal of differential amplifier 308 has a sufficiently high input impedance, the voltage generated across capacitor 405 can be kept approximately constant.

When switch signal Sw switches from the low level to the high level, since transfer gate 404 is turned on and AND circuit 503 is in the pass-through state, the feedback control of output current Io is restarted. At that time, the voltage at the time that n-type MOS transistor 10 is turned off from the previous on state is held at capacitor 405. With the held voltage used as the initial value, charge and discharge of capacitor 405 by the output current of differential amplifier 403 are restarted. Since the change in output current Io caused by changes in temperature or power supply voltage is usually well delayed compared with the switching period of n-type MOS transistor 10, the difference between the voltage held on capacitor 405 at the end of the previous feedback operation and the voltage held on capacitor 405 when the system converges to the normal state in the next feedback operation will not be too large. Consequently, current Io output from switching power supply 60 will quickly converge to the normal level after n-type MOS transistor 10 returns to the on state.

As explained above, the drive circuit shown in FIG. 2 operates in the same way as the drive circuit shown in FIG. 1, and the same effects can be realized.

Since the gain of differential amplifier 306, 308 used for error amplification is usually high, in the method shown in FIG. 1 for holding the output signal of the differential amplifier, the input differential voltage of the differential amplifier will be high, and the differential amplifier easily saturates. On the other hand, in the method shown in FIG. 2 for holding the input signal of the differential amplifier, since the feedback operation is stopped in the low input differential voltage state, the differential amplifier does not easily saturate. Therefore, the convergence time can be shortened after the feedback operation is restarted.

Third Embodiment

FIG. 3 is a block diagram illustrating an example of the configuration of the drive circuit disclosed in the third embodiment of the present invention. In FIGS. 1 and 3, the same symbols represent the same constituent elements, respectively.

In the drive circuit shown in FIG. 3, switching power supply control unit 50 in the drive circuit shown in FIG. 1 is replaced with switching power supply control unit 50A. Also, switch control unit 80 and clock signal generating unit 90 are added. The rest of the configuration of FIG. 3 is the same as the drive circuits shown in FIG. 1.

Switch control unit 80 is an embodiment of the switch control means used in the present invention.

Switching power supply control unit 50A operates switching power supply 60 in a switching period synchronously with clock signal Sclk generated by clock signal generating unit 90. Other functions are the same as those of switching power supply control unit 50 described above.

For example, as shown in FIG. 3, switching power supply control unit 50A has triangle wave signal generating unit 501A that replaces triangle wave signal generating unit 50 in switching power supply control unit 50.

Since triangle wave signal generating unit 501A generates a triangle wave synchronously to clock signal Sclk, pulse signal Spulse is also synchronized with clock signal Sclk. As a result, the switching operation of switching power supply 60 is synchronized to clock signal Sclk.

Switch control unit 80 outputs switch control signal Sw that is input to n-type MOS transistor 10. The switching on and off of n-type MOS transistor 10 is performed at a prescribed phase in the switching period of switching power supply 60.

For example, as shown in FIG. 3, the on and off states of n-type MOS transistor 10 are controlled synchronously with clock signal Sclk shared with switching power supply control unit 50A.

The switching frequency of switching power supply 60 is usually set higher than the switching frequency of n-type MOS transistor 10. In this case, for example, switch control signal Sw can be generated synchronously with a signal obtained by dividing the frequency of clock Sclk.

FIG. 4 is a timing chart illustrating the relationship between the signal waveform and the timing for each part of the drive circuit shown in FIG. 3.

When switch control signal Sw (FIG. 4(B)) changes from the low level to the high level at time t1, n-type MOS transistor 10 is turned on, and Io (FIG. 4(D)) flows as a function of the voltage on capacitor 604. Also, the voltage VLED (FIG. 4(C)) supplied from capacitor 604 to LED 71–7n drops as it is discharged by output current Io.

When pulse signal Spulse (FIG. 4(A)) changes to high level at time t2, a current is supplied to inductor 602 to store energy. At that time, the drop in voltage VLED continues because of the discharge by output current Io.

When pulse signal Spulse changes to low level at time t3, n-type MOS transistor 10 is turned off, and the energy stored in inductor 602 is released. In this way, pulse current Ipulse is output, and voltage VLED starts to rise. Then, at time t4, the signal returns to the same phase as that at time t1. Then, the same operation from time t1–4 is repeated, and output current Io is held almost constant.

The level of switch control signal Sw (FIG. 4(A)) is changed at a prescribed phase in the pulse period of pulse signal Spulse which, for example, uses the cycle of t1–4 as one period. In other words, the times (t1, t5, t6) at which the level of switch control signal Sw (FIG. 4(B)) is changed has the same phase in the switching period of switching power supply 60, and the on and off state of n-type MOS transistor 10 is switched during this phase.

If the change in the on/off state of n-type MOS transistor 10 has no relationship to the phase of pulse signal Spulse immediately before n-type MOS transistor 10 is turned off from the on state and immediately after it is turned on from the off state, the duty ratio of pulse signal Spulse (ratio between high level period and low level period in one pulse period) might become discontinuous. The output pulse current Ipulse of switching power supply 60 corresponding to the duty ratio changes. Therefore, when discontinuous change occurs in the duty ratio, output current Io changes transiently.

In the drive circuit shown in FIG. 3, since the change in the on/off state of n-type MOS transistor 10 is constantly performed at a prescribed phase, the noncontinuous change in the duty ratio can be restrained so that output current Io can be further stabilized.

The rest of the operation is the same as that of the drive circuit shown in FIG. 1, and the same effects can be realized.

Since the drive circuit shown in FIG. 3 operates with clock signal Sclk shared by switch control unit 80 and the control system of switching power supply 60 for realizing the light-adjusting function of the LED, these circuits can be easily integrated on the same semiconductor chip.

Fourth Embodiment

Figure 5:
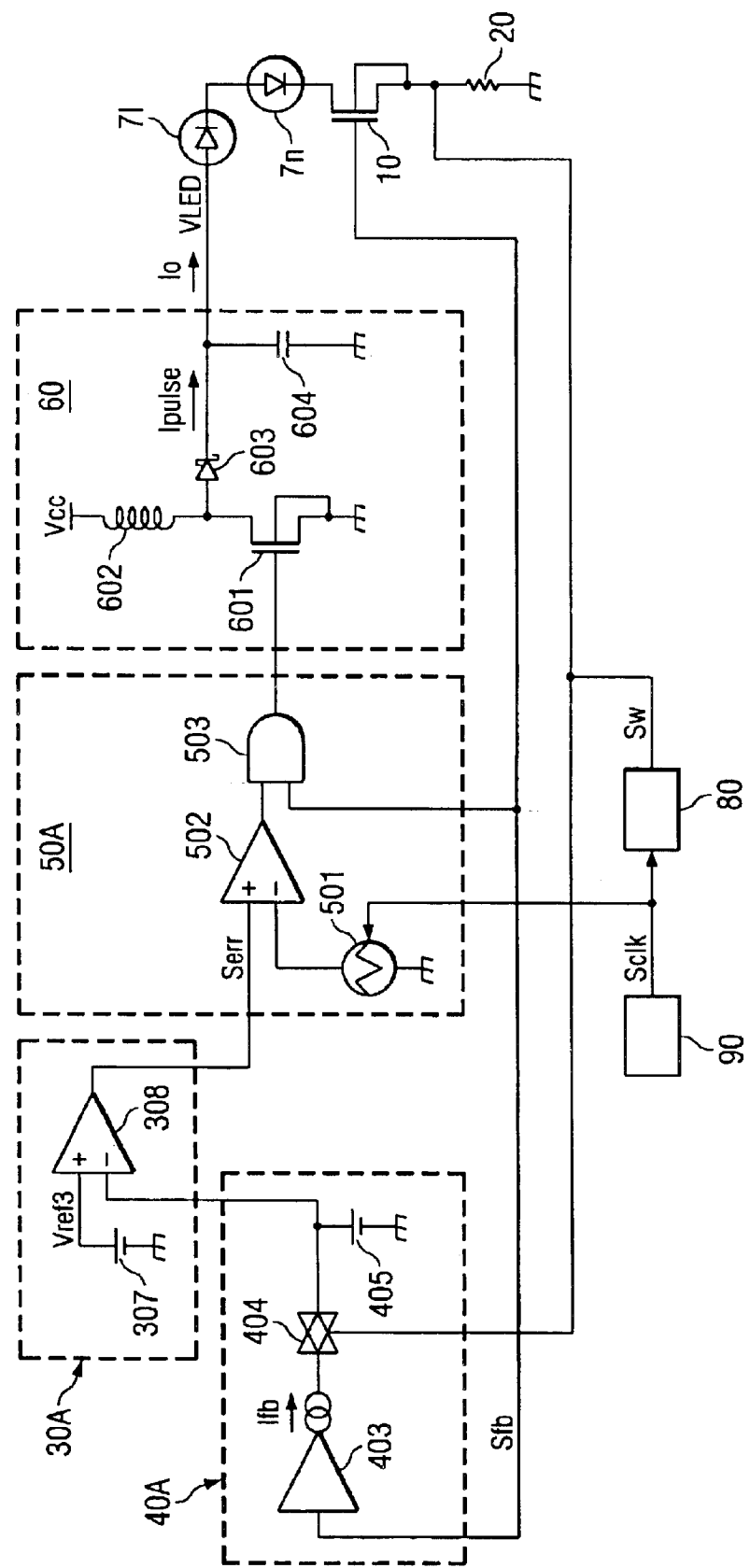
FIG. 5 is a block diagram illustrating an example of the configuration of the drive circuit disclosed in the fourth embodiment of the present invention.

FIG. 5 is a block diagram illustrating an example of the configuration of the drive circuit disclosed in a fourth embodiment of the present invention. The same symbols in FIGS. 2, 3, and 5 represent the same respective constituent elements.

In the drive circuit shown in FIG. 5, the switching power supply control unit 50 in the drive circuit shown in FIG. 2 is replaced with switching power supply control unit 50A. Also, switch control unit 80 and clock signal generating unit 90 are added. The rest of the configuration is the same as that of the drive circuits shown in FIGS. 2 and 5.

Like the drive circuit shown in FIG. 3, in the drive circuit shown in FIG. 5, the on/off state of n-type MOS transistor 10 is constantly switched at a prescribed phase, the noncontinuous change in the duty ratio can be restrained so that output current Io can be further stabilized.

The rest of the operation is the same as that of the drive circuit shown in FIG. 2, and the same effects can be realized.

Since the drive circuit operates with clock signal Sclk shared by switch control unit 80 and the control system of switching power supply 60 for realizing the light-adjusting function of the LED, these circuits can be easily integrated on the same semiconductor chip.

The present invention is not limited to the embodiments. Various modifications can be made. For example, the element used as the driven object in the embodiments is an LED. This is only an example. It is also possible to apply the drive circuit of the present invention to circuits for driving organic EL element or other elements operating at a certain current. It is also possible for signal holding part 40 described in the first and third embodiments to turn off transfer gate 401 before n-type MOS transistor 10 is turned off to hold error signal SerrA and turn on the transfer gate to start the charging/discharging of capacitor 402 after n-type MOS transistor 10 is turned on.

A signal with a stable level can be held by holding error signal SerrA before the switch is turned off. In this way, the output current Io can be stabilized after n-type MOS transistor 10 is turned on again. Also, when the charging/discharging of capacitor 402 is started after n-type MOS transistor 10 is turned on again, the transition state can be avoided when n-type MOS transistor 10 is turned on from the off state, and the feedback operation starts with output current Io in a stable state. Therefore, output current Io can be further stabilized. Similarly, it is also possible for signal holding unit 40A described in the second and fourth embodiments to turn off transfer gate 404 before n-type MOS transistor 10 is turned off to hold detection signal SfbA and turn on transfer gate 404 after n-type MOS transistor 10 is turned on to the start charging/discharging of capacitor 405. In this way, output current Io can be further stabilized.

In the explanation of each embodiment, a boost type switching power supply is used as the switching power supply. However, the present invention is not limited to this type of switching power supply. It is also possible to use a forward type, bridge type, or other type of switching power supply.

In the explanation of each embodiment, PWM control is performed for the switching power supply control unit. The present invention, however, is not limited to this type of control. It is also possible to use other methods of switching power supply control that are compatible with the circuit system of the switching power supply. For example, it is also possible to use a method that keeps the pulse width constant and modulates the pulse period corresponding to the error signal, or another method, which modulates both the pulse width and the pulse period corresponding to the error signal. The number of the generated pulse signals is not limited to one. It is also possible to generate multiple pulse signals.

What is a claimed is:

1. A drive circuit comprised of the following:
    a switching power supply,
    a switch that interrupts the power supplied from the switching power supply to a driven object,
    a detecting means that detects the current flowing in the driven object and outputs a detection signal corresponding to the detection result,
 an error signal generating means that generates an error signal corresponding to the error between the detection signal output from the detecting means and the setpoint signal,
    a signal holding means that averages the error signal generated by the error signal generating means when the switch is on, holds the averaged error signal when the switch is turned off from the on state, and starts the averaging of the error signal with the level of the held error signal as the initial level when the switch is turned on from the off state, and
    a switching power supply control means that controls the switching power supply to stop the supply of power to the driven object when the switch is off and controls the power supplied by the switching power supply to the driven object corresponding to the error signal averaged by the signal holding means when the switch is on.

2. The drive circuit described in claim 1 characterized by the fact that the signal holding means holds the error signal before the switch is turned off and starts the averaging of the error signal after the switch is turned on.

3. A drive circuit comprised of the following:
    a switching power supply,
    a switch that interrupts the power supplied from the switching power supply to a driven object,
    a detecting means that detects the current flowing in the driven object and outputs a detection signal corresponding to the detection result,
    a signal holding means that averages the detection signal generated by the detecting means when the switch is on, holds the averaged detection signal when the switch is turned off from the on state, and starts the averaging of the error signal with the level of the held error signal as the initial level when the switch is turned on from the off state,
    an error signal generating means that generates an error signal corresponding to the error between the detection signal averaged by the signal holding means and the setpoint signal, and
    a switching power supply control means that controls the switching power supply to stop the supply of power to the driven object when the switch is off and controls the power supplied by the switching power supply to the driven object corresponding to the error signal generated by the error signal generating means.

4. The drive circuit described in claim 3 characterized by the fact that the signal holding means holds the detection signal before the switch is turned off and starts the averaging of the detection signal after the switch is turned on.

5. The drive circuit described in claim 3 characterized by having a switch control means that turns the switch on and off at a prescribed phase of the switching period of the switching power supply.

6. The drive circuit described in claim 5 characterized by the fact that the switching power supply control means switches the switching power supply synchronously with an input clock signal, and
    the switch control means controls the turning on and off of the switch synchronously with the clock signal.

7. The drive circuit described in claim 6 characterized by the fact that the driven object is one or more series connected light-emitting elements.

8. The drive circuit described in claim 3 characterized by the fact that the switching power supply is a boost type switching power supply.

9. A drive circuit having the following:
    a first switching element that controls the supply of current to a driven object element,
    a second switching element connected to an inductive element in a power supply circuit that supplies the current to the driven object element,
    an error signal generating circuit that compares a detection signal from a detecting circuit corresponding to the current flowing in the driven object element with a reference signal and generates an error signal corresponding to the comparison result, and
    a power supply control circuit that generates a drive pulse signal used for driving the second switching element based on the error signal and supplies it to the second switching element synchronously with a control pulse signal that controls the first switching element.

10. The drive circuit described in claim 9 characterized by the fact that the power supply control circuit has a triangle wave signal generating circuit that can generate triangle wave signal, a comparator that compares the error signal supplied as a voltage signal with the triangle wave signal, and a logic circuit that inputs the signal output from the comparator and outputs the drive pulse signal synchronously with the control pulse signal.

11. The drive circuit described in claim 10 characterized by the fact that the triangle wave signal and the control pulse signal are generated on the basis of a reference clock signal.

12. The drive circuit described in claim 11 characterized by the fact that the drive circuit has a signal holding circuit that inputs the error signal supplied from the error signal generating circuit synchronously with the control pulse signal and outputs the held error signal to the power supply control circuit, and that
    the error signal generating circuit has a differential amplifier, which compares the voltage signal corresponding to the detection signal with a reference voltage signal, and a first switching element that supplies the detection signal to the differential amplifier synchronously with the control pulse signal.

13. The drive circuit described in claim 12 characterized by the fact that the power supply circuit has a diode, the anode of which is connected to the connection point between the inductive element and the second switching element and the cathode of which is connected to the driven object element, and a capacitor connected to the cathode of the diode, and that the detection signal is generated by a resistor connected in the current path of the driven object element.

14. The drive circuit described in claim 13 characterized by the fact that the driven object element is one or more series connected light-emitting diodes, and the first and second switching element are MOS transistors.

* * * * *